(12) United States Patent
Jang et al.

(10) Patent No.: US 12,266,674 B2
(45) Date of Patent: Apr. 1, 2025

(54) IMAGE SENSOR WITH ALUMINUM GRID PATTERN HAVING OPENINGS AND COPPER DUMMY PATTERNS COVERING THE OPENINGS

(71) Applicant: SAMSUNG ELECTRONICS CO., LTD., Suwon-si (KR)

(72) Inventors: Minho Jang, Suwon-si (KR); Kyoungwon Na, Seoul (KR); Seungkuk Kang, Seoul (KR); Hyunchul Kim, Seoul (KR); Hyun Young Yeo, Hwaseong-si (KR); In Sung Joe, Seoul (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 249 days.

(21) Appl. No.: 17/315,321

(22) Filed: May 9, 2021

(65) Prior Publication Data

US 2022/0059596 A1 Feb. 24, 2022

(30) Foreign Application Priority Data

Aug. 18, 2020 (KR) .......................... 10-2020-0103288

(51) Int. Cl.
*H01L 27/146* (2006.01)

(52) U.S. Cl.
CPC .. *H01L 27/14636* (2013.01); *H01L 27/14603* (2013.01); *H01L 27/14643* (2013.01)

(58) Field of Classification Search
CPC ......... H01L 27/14636; H01L 27/14603; H01L 27/14643
See application file for complete search history.

(56) References Cited

U.S. PATENT DOCUMENTS 8,247,852 B2 8/2012 Tai et al.
8,502,335 B2 8/2013 Tseng et al.
(Continued)

FOREIGN PATENT DOCUMENTS

JP 2011-151375 A2 8/2011
JP 2011-204915 A2 10/2011
(Continued)

OTHER PUBLICATIONS

Notice of Allowance dated Dec. 9, 2024, in corresponding Korean Patent Application Serial No. 10-2020-0103288, 8 pages.
(Continued)

*Primary Examiner* — Thao X Le
*Assistant Examiner* — Sean Ayers Winters
(74) *Attorney, Agent, or Firm* — F. CHAU & ASSOCIATES, LLC

(57) ABSTRACT

An image sensor includes a first chip that includes a pixel region and a pad region, and a second chip that is in contact with one surface of the first chip and includes circuits that drive the first chip. The first chip includes a first substrate, an interlayer insulating layer disposed between the first substrate and the second chip, first interconnection lines disposed in the interlayer insulating layer, a conductive pad disposed in the pad region between the second chip and the first interconnection lines, and a recess region formed in the pad region that penetrates the first substrate and the interlayer insulating layer and exposes the conductive pad.

10 Claims, 15 Drawing Sheets

(56) References Cited

U.S. PATENT DOCUMENTS

| | | | |
|---|---|---|---|
| 9,548,329 B2 | 1/2017 | Lin et al. | |
| 10,038,026 B2 | 7/2018 | Huang et al. | |
| 10,115,763 B2 | 10/2018 | Itonaga et al. | |
| 10,121,814 B2 | 11/2018 | Hayashi | |
| 10,229,948 B2 | 3/2019 | Shimotsusa | |
| 10,229,949 B2 | 3/2019 | Park et al. | |
| 10,297,831 B2 | 5/2019 | Ho et al. | |
| 10,367,022 B2 | 7/2019 | Kobayashi | |
| 10,403,670 B2 | 9/2019 | Umebayashi et al. | |
| 10,411,057 B2 | 9/2019 | Jeon et al. | |
| 10,453,886 B2 | 10/2019 | Takahashi et al. | |
| 10,573,679 B2 | 2/2020 | Kwon | |
| 10,622,397 B2 | 4/2020 | Ishino et al. | |
| 10,804,304 B2 | 10/2020 | Noh et al. | |
| 10,804,313 B2 | 10/2020 | Kagawa et al. | |
| 11,201,185 B2 | 12/2021 | Mitsuhashi et al. | |
| 11,563,049 B2 | 1/2023 | Nishizawa | |
| 11,869,853 B2 | 1/2024 | Mitsuhashi et al. | |
| 2008/0173966 A1* | 7/2008 | Lin | H01L 27/14685 438/618 |
| 2012/0153419 A1* | 6/2012 | Itonaga | H01L 21/76898 438/66 |
| 2013/0153901 A1* | 6/2013 | JangJian | H01L 27/14685 438/488 |
| 2015/0221695 A1 | 8/2015 | Park et al. | |
| 2016/0020235 A1* | 1/2016 | Yamashita | H01L 27/14634 250/206 |
| 2016/0351617 A1* | 12/2016 | Frey | H01L 27/14636 |
| 2017/0125459 A1* | 5/2017 | Tsai | H01L 27/1463 |
| 2018/0175091 A1* | 6/2018 | Jeon | H01L 27/14641 |
| 2019/0123088 A1* | 4/2019 | Kwon | H01L 27/14609 |
| 2019/0221597 A1* | 7/2019 | Noh | H01L 27/14605 |
| 2020/0091209 A1 | 3/2020 | Han | |
| 2020/0105814 A1 | 4/2020 | Hashiguchi et al. | |
| 2020/0105836 A1 | 4/2020 | Kim et al. | |
| 2020/0258923 A1 | 8/2020 | Ono et al. | |
| 2022/0028804 A1* | 1/2022 | Mitsuhashi | H01L 27/14636 |

FOREIGN PATENT DOCUMENTS

| | | |
|---|---|---|
| JP | 2012-015278 A2 | 1/2012 |
| JP | 2012-164870 A2 | 8/2012 |
| JP | 2013-125970 A2 | 6/2013 |
| JP | 2014-072296 A2 | 4/2014 |
| JP | 2017-022207 A2 | 1/2017 |
| JP | 2019-102619 A2 | 6/2019 |
| JP | 2019-125784 A2 | 7/2019 |
| JP | 2020-092146 A2 | 6/2020 |
| KR | 10-2015-0091714 A | 8/2015 |
| KR | 10-2016-0067844 A | 6/2016 |
| KR | 10-2018-0071802 A | 6/2018 |
| KR | 10-2019-0045642 A | 5/2019 |
| KR | 10-2019-0086246 A | 7/2019 |
| KR | 10-2020-0035940 | 4/2020 |
| WO | 2015050000 A1 | 4/2015 |
| WO | 2018186195 A1 | 10/2018 |
| WO | 2019188026 A1 | 10/2019 |
| WO | WO 2020/044943 | 3/2020 |

OTHER PUBLICATIONS

Japanese Examination Report dated Jan. 28, 2025 in corresponding Japanese Patent Application 2021-15538, 6 pages.

* cited by examiner

IMAGE SENSOR WITH ALUMINUM GRID PATTERN HAVING OPENINGS AND COPPER DUMMY PATTERNS COVERING THE OPENINGS

CROSS-REFERENCE TO RELATED APPLICATION

This U.S. non-provisional patent application claims priority under 35 U.S.C. § 119 from Korean Patent Application No. 10-2020-0103288, filed on Aug. 18, 2020 in the Korean Intellectual Property Office, the contents of which are herein incorporated by reference in their entirety.

BACKGROUND

Embodiments of the inventive concepts are directed to an image sensor.

Image sensors are semiconductor devices that convert optical signals into electrical signals. Image sensors may be categorized as charge coupled device (CCD) image sensors and complementary metal-oxide-semiconductor (CMOS) image sensors. CIS is short for the CMOS image sensor. A CIS includes a plurality of pixels that are two-dimensionally arranged. Each of the pixels includes a photodiode (PD). The photodiode converts incident light into an electrical signal.

SUMMARY

Embodiments of the inventive concepts provide an image sensor that can simplify manufacturing processes and an interconnection structure.

In an embodiment, an image sensor includes a first chip that includes a pixel region and a pad region, and a second chip that is in contact with one surface of the first chip and includes circuits that drive the first chip. The first chip includes a first substrate, an interlayer insulating layer disposed between the first substrate and the second chip, first interconnection lines disposed in the interlayer insulating layer, a conductive pad disposed in the pad region between the second chip and the first interconnection lines, and a recess region formed in the pad region that penetrates the first substrate and the interlayer insulating layer and exposes the conductive pad.

In an embodiment, an image sensor includes a first chip that includes a pixel region and a pad region, and a second chip that is in contact with one surface of the first chip and includes circuits that drive the first chip. The first chip includes a first substrate, an interlayer insulating layer disposed between the first substrate and the second chip, first interconnection lines disposed in the interlayer insulating layer, metal patterns disposed between the second chip and the first interconnection lines, the metal patterns including a conductive pad in the pad region and a first metal pattern in the pixel region, and upper connection pads disposed between the first metal pattern and the second chip. The first metal pattern includes openings, and the upper connection pads cover the openings.

In an embodiment, an image sensor includes a first chip that includes a pixel region and a pad region, and a second chip that is in contact with one surface of the first chip and includes circuits that drive the first chip. The first chip includes a first substrate, an interlayer insulating layer disposed between the first substrate and the second chip, first interconnection lines disposed in the interlayer insulating layer, a first metal pattern disposed in the pixel region between the second chip and the first interconnection lines, and upper connection pads disposed between the first metal pattern and the second chip. The second chip includes a second substrate, second interconnection lines on the second substrate, and lower connection pads connected to the upper connection pads. The upper connection pads and the lower connection pads include the same metal.

In an embodiment, a method of manufacturing an image sensor includes the steps of: manufacturing a first chip that includes a first interlayer insulating layer formed on a first surface of a first substrate, first interconnection lines and an upper insulating layers formed on the first interlayer insulating layer, and contact plugs connected to the first interconnection lines formed in the upper insulating layer; forming metal patterns on the contact plugs; forming a second interlayer insulating layer that covers the metal patterns, and forming upper connection pads connected to the metal patterns in the second interlayer insulating layer, manufacturing a second chip that includes lower connection pads in a lower insulating layer; placing the first chip on the second chip wherein the upper insulating layer is in contact with the lower interlayer insulating layer and the upper connection pads are in contact with the lower connection pads; performing a thermal compression process to bond the first chip to the second chip; and forming a recess region that exposes some of the metal patterns.

DETAILED DESCRIPTION

Hereinafter, embodiments of the inventive concepts will be described in more detail with reference to the accompanying drawings.

Figure 1:
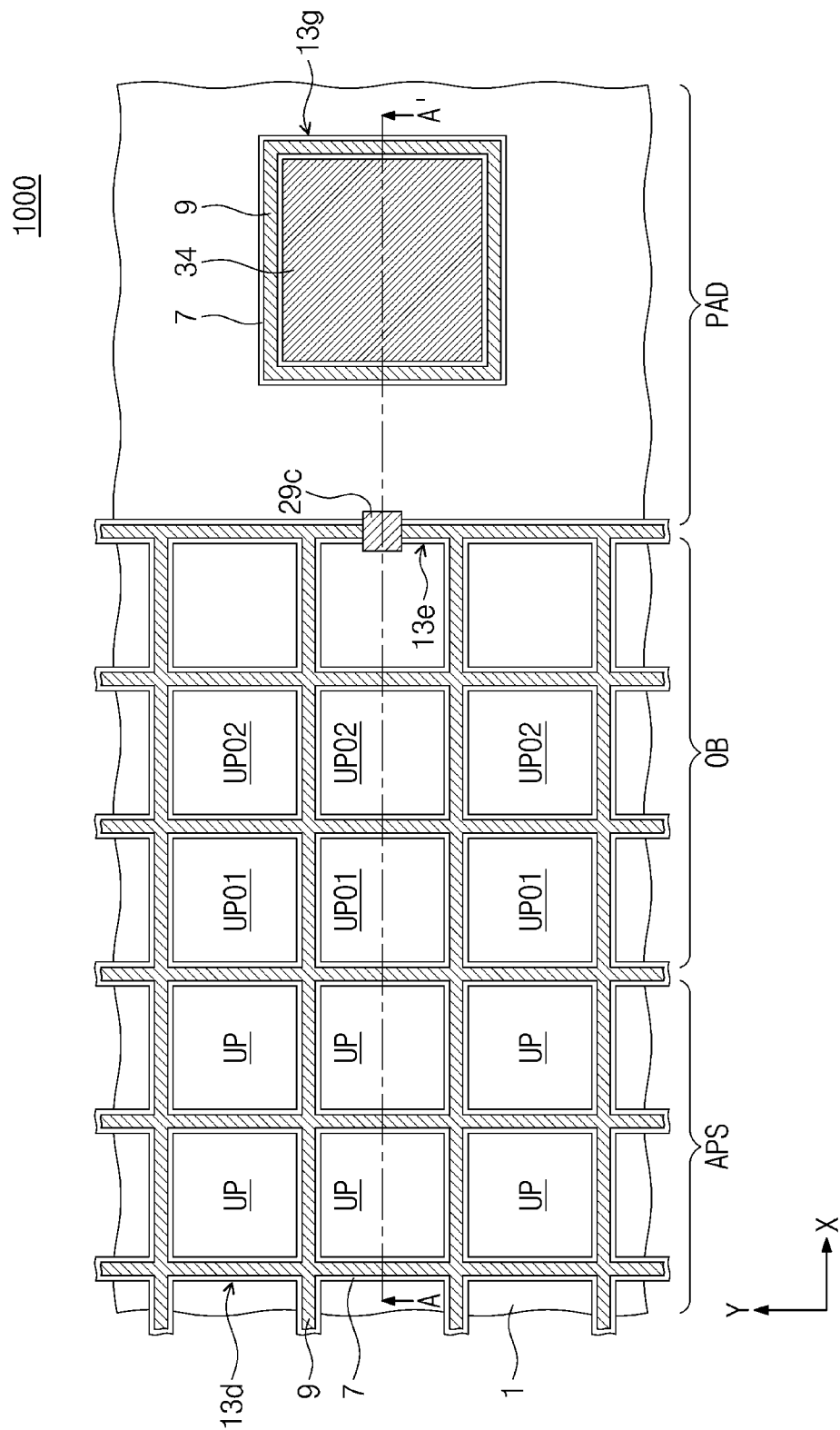
FIG. 1 is a plan view of an image sensor according to some embodiments of the inventive concepts.
Figure 2:
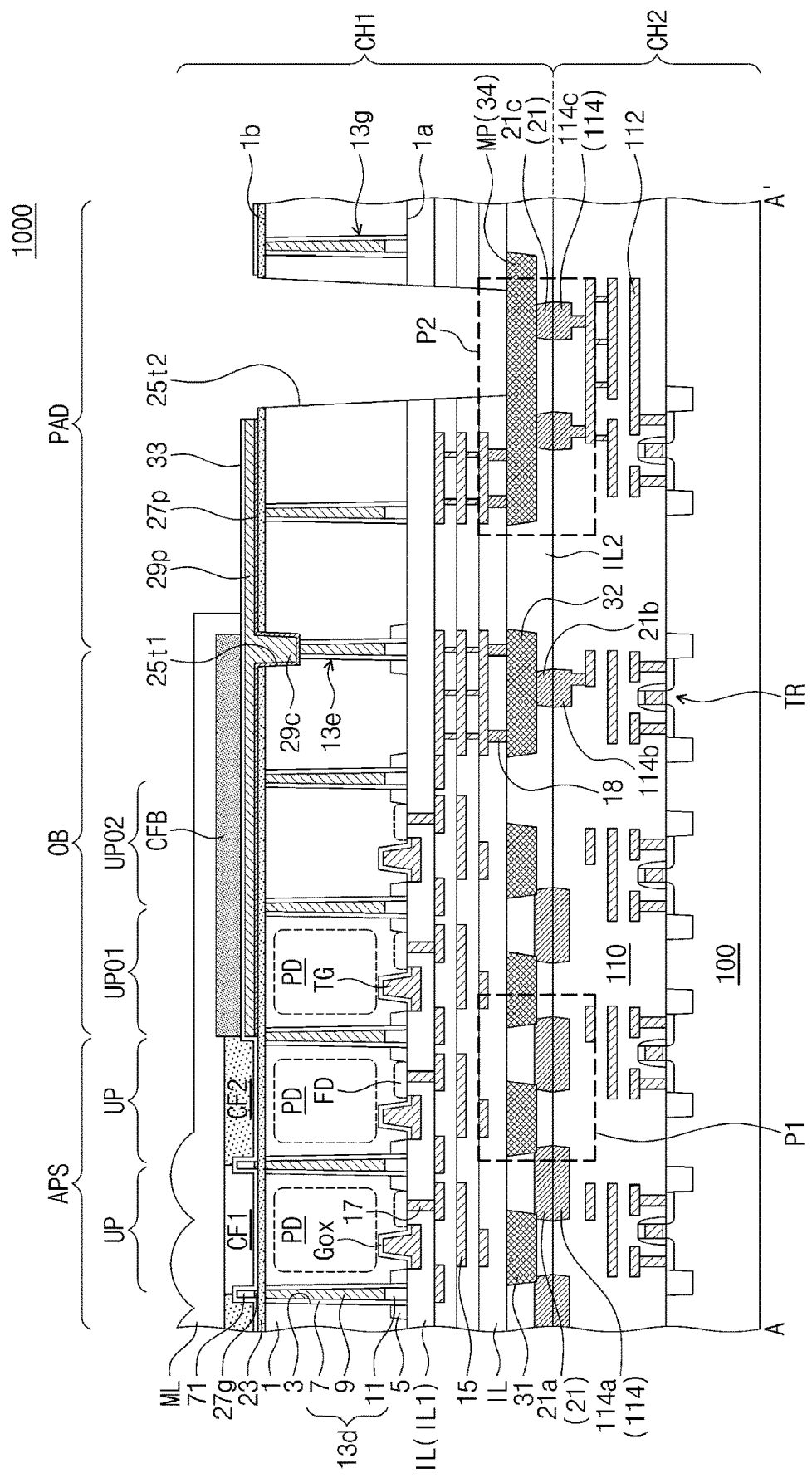
FIG. 2 is a cross-sectional view taken along a line A-A' of FIG. 1 according to some embodiments of the inventive concepts.

FIG. 1 is a plan view of an image sensor according to some embodiments of the inventive concepts. FIG. 2 is a cross-sectional view taken along a line A-A' of FIG. 1 according to some embodiments of the inventive concepts.

Referring to FIGS. 1 and 2, an image sensor 1000 according to a present embodiment has a structure in which a first chip CH1 and a second chip CH2 are bonded to each other. The first chip CH1 performs an image sensing function. The second chip CH2 includes circuits for driving the first chip CH1 or for processing and storing electrical signals generated from the first chip CH1.

In a present embodiment, the first chip CH1 includes a first substrate 1 that includes a pad region PAD, an optical black region OB, and a pixel region APS. The optical black region OB and the pad region PAD are disposed by at least one side of the pixel region APS. For example, each of the optical black region OB and the pad region PAD may surround the pixel region APS when viewed in a plan view. The first substrate 1 includes a first surface 1a and a second surface 1b that are opposite to each other. The first substrate 1 may be a single-crystalline silicon wafer, a silicon epitaxial layer, or a silicon-on-insulator (SOI) substrate. The first substrate 1 is doped with dopants of a first conductivity type. For example, the first conductivity type may be a P-type.

In a present embodiment, the pixel region APS includes a plurality of unit pixels UP that are two-dimensionally arranged in a first direction X and a second direction Y that crosses the first direction. In the pixel region APS, a deep device isolation portion 13d is disposed in the first substrate 1 to isolate the unit pixels UP from each other. A shallow device isolation portion 5 is disposed on the first surface 1a of the first substrate 1 and adjacent to deep device isolation portion 13d. The deep device isolation portion 13d penetrates the shallow device isolation portion 5.

In a present embodiment, the deep device isolation portion 13d includes a conductive pattern 9 disposed in a deep trench 3, an isolation insulating layer 7 that surrounds a sidewall of the conductive pattern 9, and a filling insulation pattern 11 disposed between the conductive pattern 9 and the first surface 1a of the first substrate 1. The conductive pattern 9 includes a conductive material, such as a metal or poly-silicon doped with dopants. The isolation insulating layer 7 includes, for example, a silicon oxide layer. The filling insulation pattern 11 includes, for example, a silicon oxide layer. As illustrated in FIGS. 1 and 2, the conductive pattern 9 of the deep device isolation portion 13d has a lattice or grid shape and is connected to a bias contact plug 29c to be described below.

In a present embodiment, a photoelectric conversion portion PD is disposed in the first substrate 1 in each of the unit pixels UP. A photoelectric conversion portion PD is also disposed in the first substrate 1 in the optical black region OB. The photoelectric conversion portion PD is doped with dopants of a second conductivity type that is opposite to the first conductivity type. The second conductivity type may be, for example, an N-type. The N-type dopants in the photoelectric conversion portion PD form a PN junction with the P-type dopants in a region of the first substrate 1 adjacent to the photoelectric conversion portion PD, and thus a photodiode is provided.

In a present embodiment, in each of the unit pixels UP, a transfer gate TG is disposed on the first surface 1a of the first substrate 1. A portion of the transfer gate TG may extend into the first substrate 1. A gate insulating layer Gox is disposed between the transfer gate TG and the first substrate 1. A floating diffusion region FD is disposed in the first substrate 1 at a side of the transfer gate TG. The floating diffusion region FD is doped with dopants of the second conductivity type.

Light is incident into the first substrate 1 through the second surface 1b of the first substrate 1. Electron-hole pairs (EHPs) are generated by the incident light in a depletion region of the PN junction. The generated electrons diffuse into the photoelectric conversion portion PD. When a voltage is applied to the transfer gate TG, the electrons diffuse into the floating diffusion region FD.

In a present embodiment, the first surface 1a is covered with one or more upper interlayer insulating layers IL. Each of the upper interlayer insulating layers IL is formed of at least one of a silicon oxide layer, a silicon nitride layer, a silicon oxynitride layer, or a porous low-k dielectric layer. First interconnection lines 15 are disposed between or in the upper interlayer insulating layers IL. The first interconnection lines 15 include a metal such as copper. The floating diffusion regions FD are connected to the first interconnection lines 15 through first contact plugs 17. The first contact plugs 17 penetrate a first interlayer insulating layer IL1, closest to the first surface 1a, of the upper interlayer insulating layers IL in the pixel region APS.

In a present embodiment, upper connection pads 21 are disposed in a second interlayer insulating layer IL2 of the upper interlayer insulating layers IL that is farthest from the first surface Ia. The upper connection pads 21 are exposed at one surface of the first chip CH1 and are in direct contact with lower connection pads 114 of the second chip CH2. The upper connection pads 21 include, for example, copper. Metal patterns MP are disposed between the upper connection pads 21 and the first interconnection lines 15. The metal patterns MP are disposed in the second interlayer insulating layer IL2. The metal patterns MP include a conductive pad 34 in the pad region PAD. Each conductive pad 34 is directly connected to a corresponding upper connection pad 21. The conductive pad 34 is connected to a circuit outside the chip by, for example, a bonding wire. One conductive pad 34 is illustrated. However, a plurality of the conductive pads 34 are arranged in the pad region PAD around the pixel region APS.

In a present embodiment, the metal patterns MP further include a first metal pattern 31 in the pixel region APS and a second metal pattern 32 provided in the optical black region OB. The metal patterns MP include a metal that differs from that of the upper connection pads 21. For example, the metal patterns MP include aluminum. The first metal pattern 31 and the second metal pattern 32 are disposed at the same level as the conductive pad 34.

In a present embodiment, light is not incident into the first substrate 1 of the optical black region OB. The deep device isolation portion 13d also extends into the optical black region OB to isolate a first black pixel UPO1 and a second black pixel UPO2 from each other. The photoelectric conversion portion PD is disposed in the first substrate t of the first black pixel UPO1. No photoelectric conversion portion PD is present in the first substrate 1 of the second black pixel UPO2. A transfer gate TG and a floating diffusion region FD are disposed in each of the first and second black pixels UPO1 and UPO2. The first black pixel UPO1 can sense the amount of charge generated from the photoelectric conversion portion PD into which no light is incident, and thus the first black pixel UPO1 provides a first reference charge amount. The first reference charge amount is used as a relative reference value when the amount of charge generated from the unit pixels UP is calculated. The second black pixel UPO2 can sense the amount of charge generated when no photoelectric conversion portion PD is present, and thus the second black pixel UPO2 provides a second reference charge amount. The second reference charge amount is used as data for removing process noise.

In a present embodiment, reset transistors, selection transistors and source follower transistors are disposed on the first surface 1a of the first substrate 1. The image sensor 1000 is a backside illuminated image sensor. The second surface 1b of the first substrate 1 is covered with a back insulating layer 23. The back insulating layer 23 is disposed in the pixel region APS, the optical black region OB, and the pad region PAD.

In a present embodiment, the back insulating layer 23 includes at least one of a bottom anti-reflective coating (BARC) layer, a fixed charge layer, an adhesive layer, an anti-reflection layer, or a protective layer. A fixed charge layer includes a metal oxide layer that contains insufficient oxygen in terms of a stoichiometric ratio or a metal fluoride layer that contains insufficient fluorine in terms of a stoichiometric ratio. Thus, the fixed charge layer has negative fixed charges. The fixed charge layer may be formed of a metal oxide or metal fluoride that includes at least one metal of hafnium (Hf), zirconium (Zr), aluminum (Al), tantalum (Ta), titanium (Ti), yttrium (Y), or lanthanoid. Hole accumulation occurs around the fixed charge layer. Thus, a dark current and a white spot can be effectively reduced.

In a present embodiment, an anti-reflection layer prevents reflection of light such that light incident on the second surface 1b of the first substrate 1 smoothly reaches the photoelectric conversion portion PD. An anti-reflection layer may include a metal oxide, such as aluminum oxide or hafnium oxide, or a silicon-based insulating material, such as silicon oxide or silicon nitride.

In a present embodiment, a first recess region 25t1 if formed that penetrates the back insulating layer 23 and a portion of the first substrate 1 between the optical black region OB and the pad region PAD. A sidewall of the first recess region 25t1 is aligned with a sidewall of the back insulating layer 23. The first recess region 25t1 exposes an outermost deep device isolation portion 13e of the deep device isolation portion 13d.

In a present embodiment, in the pad region PAD, a second recess region 25t2 is formed that penetrates the back insulating layer 23 and the first substrate 1 and penetrates a portion of the first interlayer insulating layer IL1. The second recess region 25t2 exposes the conductive pad 34. A sidewall of the second recess region 25t2 is aligned with a sidewall of the back insulating layer 23. The second recess region 25t2 is spaced apart from the first recess region 25t1. A width of the second recess region 25t2 increases with increasing distance from the conductive pad 34.

In a present embodiment, a pad isolation portion 3g penetrates the first substrate 1 of the pad region PAD. The pad isolation portion 13g is spaced apart from the second recess region 25t2. The pad isolation portion 13g surrounds the conductive pad 34 when viewed in a plan view. Like the deep device isolation portion 13d, the pad isolation portion 13g includes a conductive pattern 9 disposed in a deep trench 3, an isolation insulating layer 7 that surrounds a sidewall of the conductive pattern 9, and a filling insulation pattern 11 disposed between the conductive pattern 9 and the first interlayer insulating layer IL1. The conductive pattern 9 of the pad isolation portion 13g is not supplied with a voltage but is electrically insulated. Alternatively, a bias contact plug connected to the conductive pattern 9 of the pad isolation portion 13g may be provided.

In a present embodiment, in the optical black region OB and the pad region PAD, a diffusion barrier pattern 27p and a first optical black pattern 29p are disposed on the back insulating layer 23. The diffusion barrier pattern 27p conformally covers an inner surface of the first recess region 25t1. The diffusion barrier pattern 27p is formed of a metal nitride such as TiN, TaN, or WN. The first optical black pattern 29p is formed of, for example, tungsten. The first optical black pattern 29p fills the first recess region 25t1 and forms the bias contact plug 29c. The bias contact plug 29c is connected to the outermost deep device isolation portion 13e. A negative voltage can be applied to the conductive pattern 9 of the deep device isolation portion 13d through the bias contact plug 29c. Thus, holes which may be present at a surface of the deep device isolation portion 13d can be captured to reduce or minimize a dark current.

In a present embodiment, in the pixel region APS, a light blocking grid pattern 27g is disposed on the back insulating layer 23. The light blocking grid pattern 27g overlaps the deep device isolation portion 13d and has a grid or lattice structure when viewed in a plan view. A low-refractive index pattern 71 is disposed on the light blocking grid pattern 27g. The low-refractive index pattern 71 includes an organic material. The low-refractive index pattern 71 has a refractive index that is lower than those of color filters CF1 and CF2. For example, the low-refractive index pattern 71 has a refractive index of about 1.3 or less. The low-refractive index pattern 71 overlaps with the light blocking grid pattern 27g and has the same planar shape as the light blocking grid pattern 27g. A passivation layer 33 is conformally disposed on the whole of the second surface 1b of the first substrate 1 that covers the blocking grid pattern 27g, the back insulating layer 23, and the first optical black pattern 29p.

In a present embodiment, in the pixel region APS, color filters CF1 and CF2 are disposed between the low-refractive index patterns 71. The color filters CF1 and CF2 have different colors selected from blue, green or red. In the optical black region OB, a second optical black pattern CFB is disposed on the back insulating layer 23. The second optical black pattern CFB includes the same material as a blue color filter.

In a present embodiment, the pixel region APS and the optical black region OB are covered with a micro lens layer ML. Unlike FIG. 2, the micro lens layer ML may also be provided on the pad region PAD. The micro lens layer ML has a convex lens shape on each of the unit pixels UP of the pixel region APS. The micro lens layer ML has a flat top surface on the optical black region OB.

In a present embodiment, the second chip CH2 includes a second substrate 100, a plurality of transistors TR disposed on the second substrate 100, a lower interlayer insulating layer 110 that covers the second substrate 100, second interconnection lines 112 disposed in the lower interlayer insulating layer 110, and lower connection pads 114 connected to the uppermost second interconnection lines 112. The lower interlayer insulating layer 110 may have a single-layered or a multi-layered structure that includes at least one of a silicon oxide layer, a silicon nitride layer, a silicon oxynitride layer, or a porous insulating layer. The lower connection pads 114 include the same material, such as copper, as the upper connection pads 21. The lower connection pads 114 are exposed at one surface of the second chip CH2 and are in direct contact with the upper connection pads 21 of the first chip CH1. The upper interlayer insulating layer IL is in contact with the lower interlayer insulating layer 110. Hereinafter, a contact surface of the first chip CH1 and the second chip CH2 is referred to as a connection interface CI.

Figure 3:
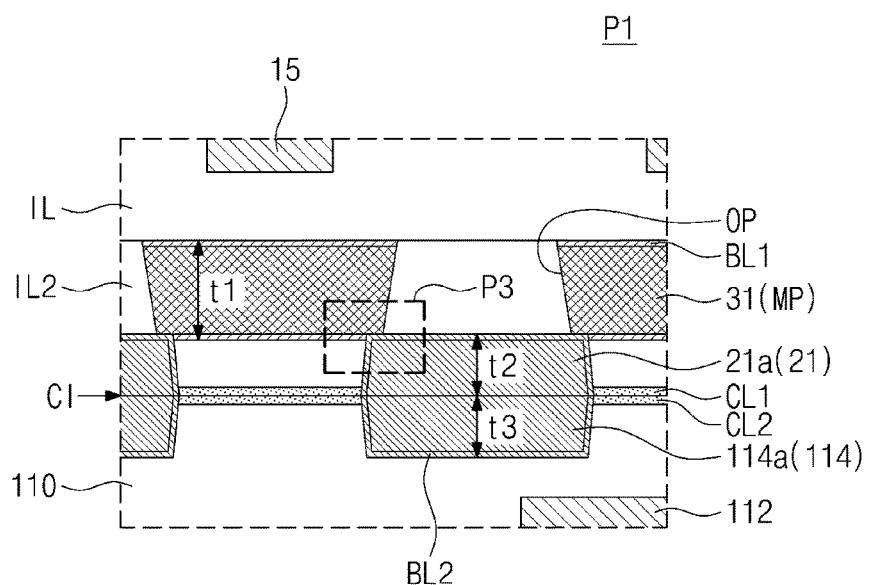
FIG. 3 is an enlarged view of a portion 'P1' of FIG. 2.
Figure 4:
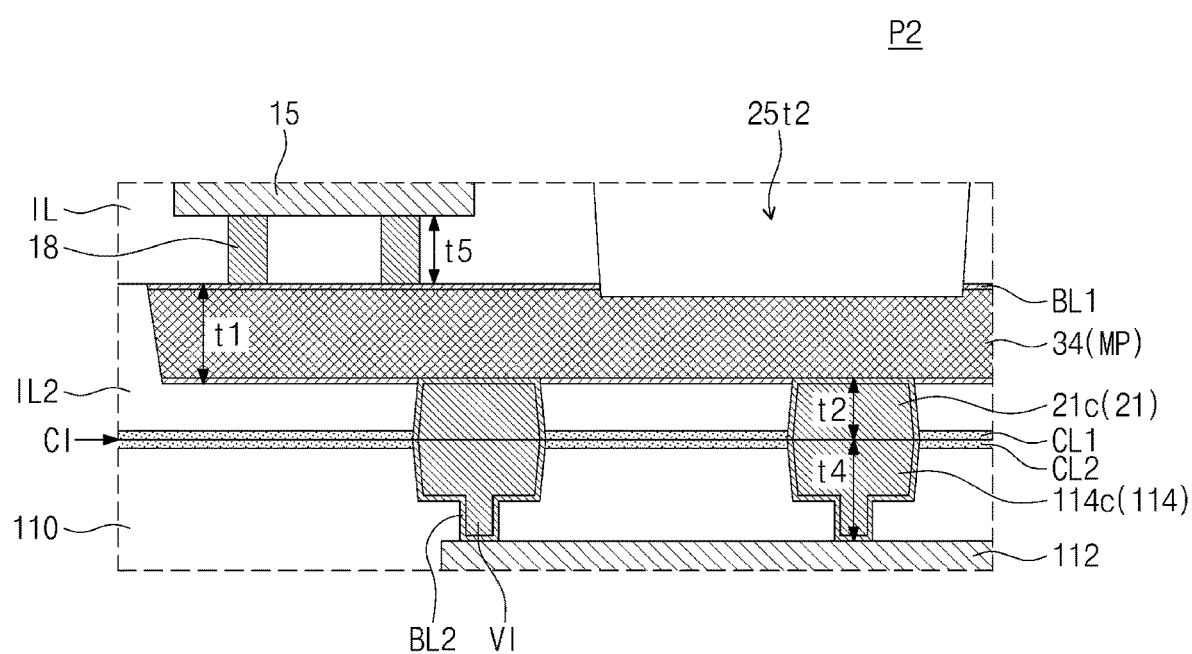
FIG. 4 is an enlarged view of a portion 'P2' of FIG. 2.
Figure 5:
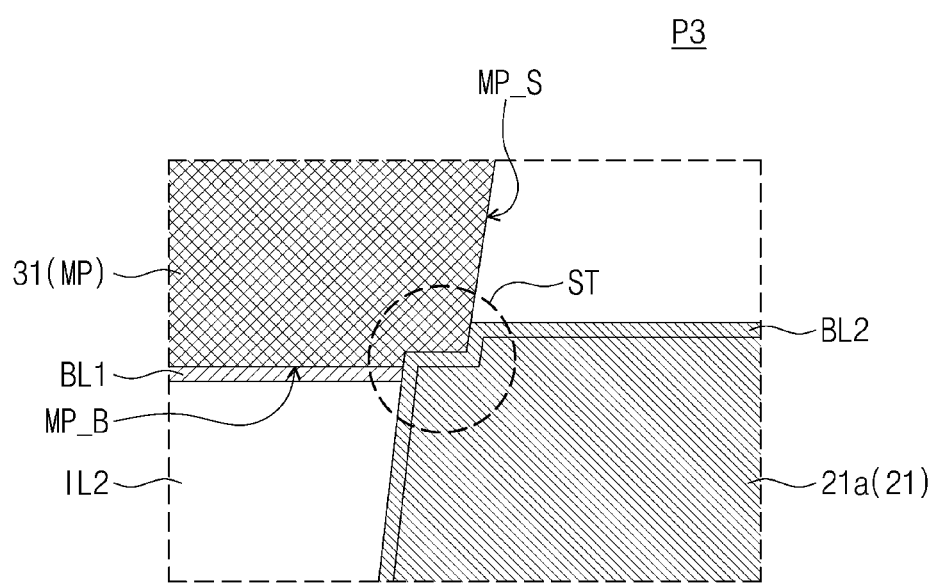
FIG. 5 is an enlarged view of a portion 'P3' of FIG. 3.

FIG. 3 is an enlarged view of a portion 'P' of FIG. 2. FIG. 4 is an enlarged view of a portion 'P2' of FIG. 2. FIG. 5 is an enlarged view of a portion 'P3' of FIG. 3. Hereinafter, shapes and arrangements of the metal patterns MP and the connection pads 21 and 114 will be described in more detail.

Referring to FIGS. 2 to 5, in a present embodiment, second contact plugs 18 connect the first interconnection lines 15 to the second metal pattern 32 in the optical black region OB and connect the first interconnection lines 15 to the conductive pad 34 in the pad region PAD. The second contact plugs 18 include a different metal from that of the first interconnection lines 15. For example, the second contact plugs 18 include at least one of tungsten, titanium, tantalum, or any conductive nitride thereof. The second contact plugs 18 are not provided in the pixel region APS, and the first metal pattern 31 are not electrically connected to the first interconnection lines 15.

In a present embodiment, each of the metal patterns MP includes a first barrier layer BL1 disposed on its bottom surface MP_B and top surface. The first barrier layer BL1 is not disposed on sidewalls MP_S of the metal patterns MP. The first barrier layer BL1 includes at least one of titanium, tantalum, tungsten, or any conductive metal nitride thereof. A width of each of the metal patterns MP decreases toward the second chip CH2.

In a present embodiment, each of the connection pads 21 and 114 includes a second barrier layer BL2. The second barrier layer BL2 includes at least one of titanium, tantalum, tungsten, or any conductive metal nitride thereof. The second barrier layer BL2 is disposed on a top surface and a sidewall of each of the upper connection pads 21 but not on a bottom surface of each of the upper connection pads 21, which are in contact with the lower connection pad 14. Likewise, the second barrier layer BL2 is disposed on a bottom surface and a sidewall of each of the lower connection pads 114 but not on a top surface of each of the lower connection pads 114, which are in contact with the upper connection pad 21. In other words, the second barrier layer BL2 is not provided at the connection interface C1. Contrary to the metal patterns MP, a width of each of the upper connection pads 21 increases toward the second chip CH2. A width of each of the lower connection pads 114 increases toward the first chip CH1.

In a present embodiment, the upper connection pads 21 include first upper connection pads 21a in the pixel region APS, second upper connection pads 21b in the optical black region OB, and third upper connection pads 21c in the pad region PAD. The lower connection pads 114 include first lower connection pads 114a connected to the first upper connection pads 21a, second lower connection pads 114b connected to the second upper connection pads 21b, and third lower connection pads 114c connected to the third upper connection pads 21c.

As illustrated in FIG. 5, in a present embodiment, the upper connection pads 21 penetrate the first barrier layers BL1 of the bottom surfaces MP_B of the metal patterns MP. At least one of the upper connection pad 21 and the metal pattern MP has a step structure ST in a connection portion of the upper connection pad 21 and the metal pattern MP. As illustrated in FIG. 4, the second recess region 25r2 penetrates the first barrier layer BL1 of the top surface of a corresponding metal pattern MP.

In a present embodiment, the first lower connection pads 114a are not electrically connected to the second interconnection lines 112. On the other hand, the second and third lower connection pads 114b and 114c may be electrically connected to the second interconnection lines 112. For example, the second and third lower connection pads 114b and 114c include vias VI, shown in FIG. 4, thereunder through which the second and third lower connection pads 114b and 114c are connected to the second interconnection lines 112. The first lower connection pads 114a do not include a via connected to the second interconnection lines 112.

In a present embodiment, the second interlayer insulating layer IL2 includes a first connection insulating layer CL1 at the connection interface CI. The lower interlayer insulating layer 110 includes a second connection insulating layer CL2 at the connection interface C1. The first connection insulating layer CL1 is in direct contact with the second connection insulating layer CL2. Each of the first and second connection insulating layers CL1 and CL2 includes at least one of SiCN, SiOCN, or SiC.

In a present embodiment, a thickness t1 of each of the metal patterns MP is greater than a thickness t2 of each of the upper connection pads 21. The thickness t1 of each of the metal patterns MP is greater than a thickness t3 of each of the first lower connection pads 114a. On the other hand, the thickness t1 of each of the metal patterns MP is less than a thickness t4 of each of the second and third lower connection pads 114b and 114c. The thickness t1 of each of the metal patterns MP is greater than a thickness t5 of each of the second contact plugs 18. For example, the thickness t1 of each of the metal patterns MP ranges from about 6000 Å to about 12000 Å. A thickness of the first barrier layer BL1 ranges from about 100 Å to about 600 Å. The thickness t2 of each of the upper connection pads 21 and the thickness t3 of each of the first lower connection pads 114a range from about 5000 Å to about 10000 Å. The thickness t4 of each of the second and third lower connection pads 114b and 114c ranges from about 11000 Å to about 15000 Å.

Figure 6:
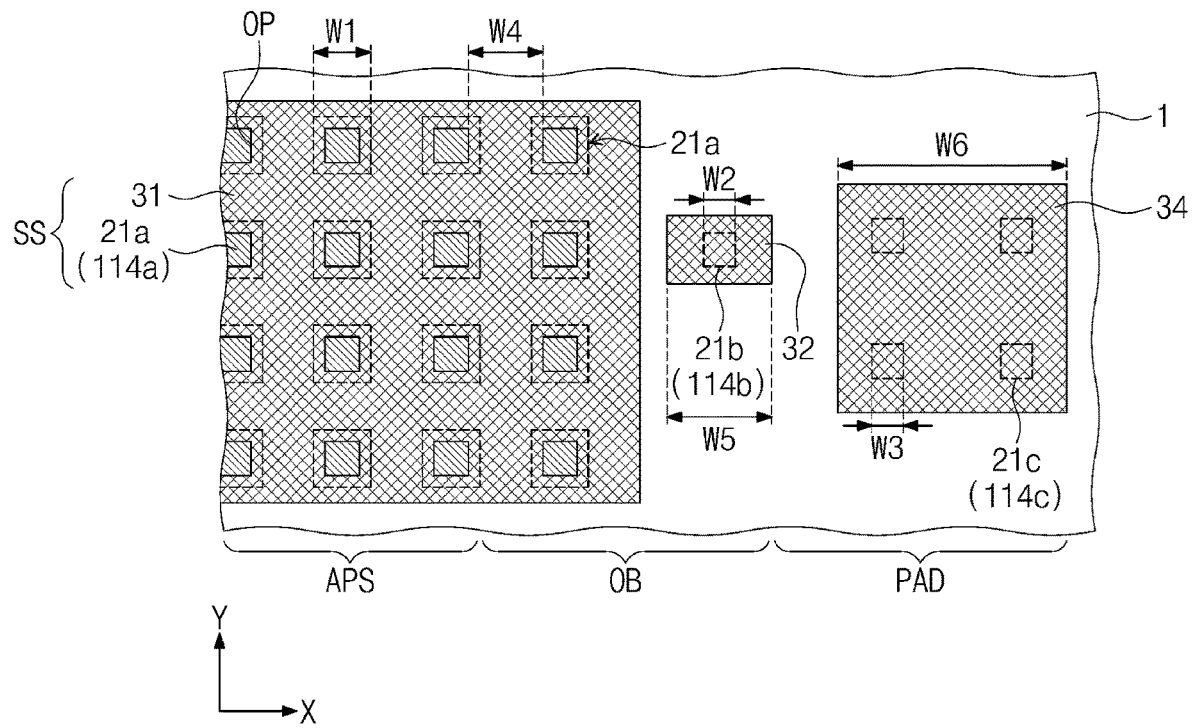
FIGS. 6 and 7 are plan views of arrangements of metal patterns and connection pads.
Figure 7:
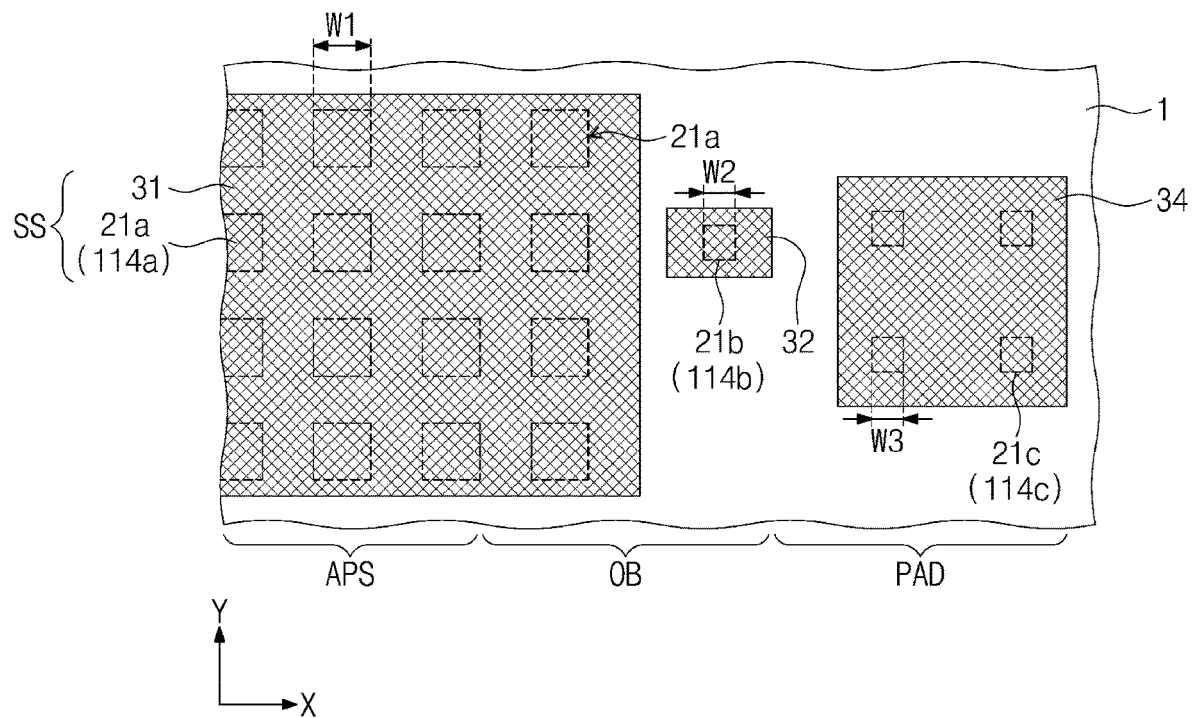

FIGS. 6 and 7 are plan views of arrangements of the metal patterns MP and the connection pads 21 and 114. Referring to FIG. 6, the first metal pattern 31 has a grid shape that includes a plurality of openings OP that are two-dimensionally arranged in the first direction X and the second direction Y. In other words, the first metal pattern 31 has a mesh shape in which line portions that extend in the first direction X intersect line portions that extend in the second direction Y. The first upper connection pads 21a and the first lower connection pads 114a, hereinafter, referred to as first connection pads 21a and 114a, are coupled to the first metal pattern 31 and cover the openings OP, as shown in the cross-sectional view of FIG. 3. The first connection pads 21a and 114a have widths in the first and second directions X and Y that are greater than those of the openings OP. As a result, the first metal pattern 31 and the first connection pads 21a and 114a form a shielding structure SS that covers the pixel region APS. For example, the shielding structure SS completely covers the pixel region APS, in particular, the unit pixels UP in the pixel region APS, to shield noise caused by an electromagnetic field induced by operation of the circuits in the second chip CH2. The shielding structure SS also covers a portion of the optical black region OB. In operation of the image sensor, a ground voltage is applied to the shielding structure SS.

In a present embodiment, a width w1 of each of the first upper connection pads 21a is greater than a width w2 of each of the second upper connection pads 21b and a width w3 of each of the third upper connection pads 21c. Hereinafter, a width means a width in the first direction X. However, embodiments of the inventive concepts are not limited thereto. A width w4 of the first metal pattern 31 between a pair of adjacent openings OP is less than a width w6 of the conductive pad 34. A width w5 of the second metal pattern 32 is less than the width w6 of the conductive pad 34. Referring to FIG. 7, the first metal pattern 31 does not include the openings OP described with reference to FIG. 6. A width of each of the lower connection pads 114 corresponds to the width of the upper connection pad 21 connected thereto. For example, a width of each of the first lower connection pads 114a is substantially equal to the width w1 of each of the first upper connection pads 21a, a width of each of the second lower connection pads 114b is substantially equal to the width w2 of each of the second upper connection pads 21b, and a width of each of the third lower connection pads 114c is substantially equal to the width w3 of each of the third upper connection pads 21c.

According to the embodiments of the inventive concepts, the conductive pad 34 is positioned in the first chip CH1, and thus an interconnection structure between the conductive pad 34 and the first chip CH1 can be simplified.

FIGS. 8 to 15 are cross-sectional views taken along the line A-A' of FIG. 1 that illustrate a method of manufacturing an image sensor, according to some embodiments of the inventive concepts.

Figure 8:
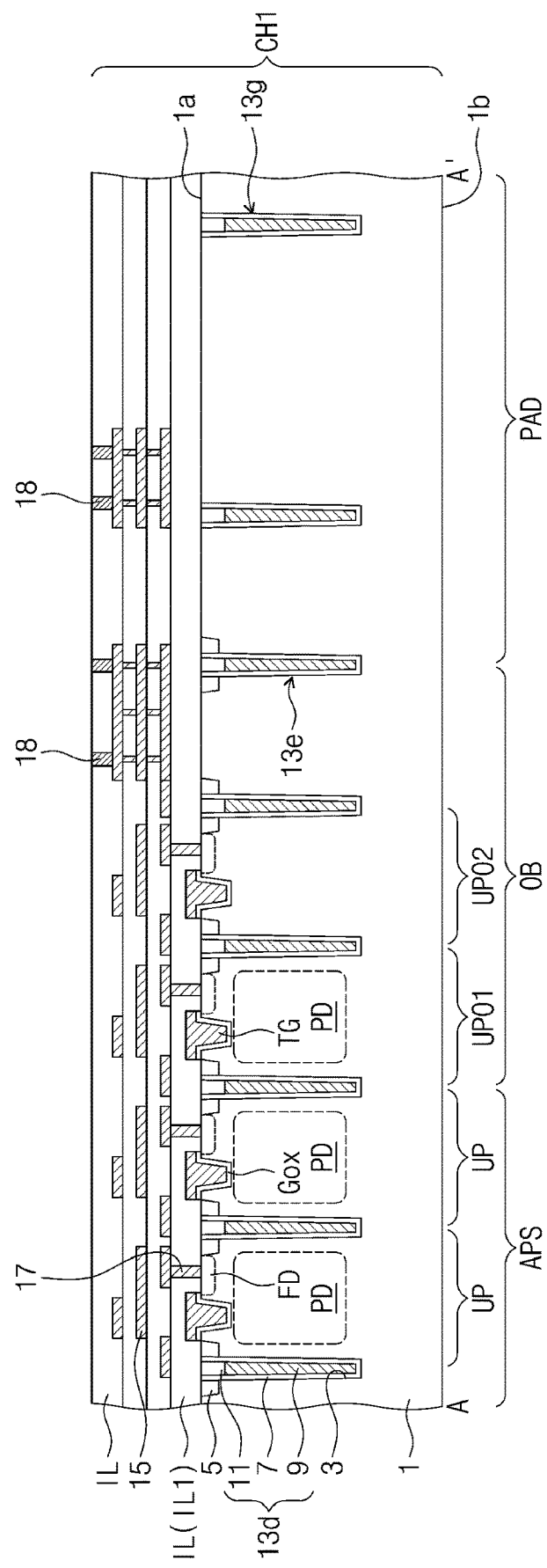
FIGS. 8 to 15 are cross-sectional views taken along the line A-A' of FIG. 1 that illustrate a method of manufacturing an image sensor, according to some embodiments of the inventive concepts.

Referring to FIG. 8, in a present embodiment, a first chip CH1 is manufactured. To achieve this, an ion implantation process is performed on a first substrate 1 that includes a pixel region APS, an optical black region OB and a pad region PAD, thereby forming photoelectric conversion portions PD. A shallow device isolation portion 5 is formed in a first surface 1a of the first substrate 1 to define active regions. The shallow device isolation portion 5 is formed by a shallow trench isolation (STI) process. Deep trenches 3 are formed by etching the shallow device isolation portion 5 and a portion of the first substrate 1. The deep trenches 3 define unit pixels UP and black pixels UPO1 and UPO2 in the pixel region APS and the optical black region OB. The deep trench 3 defines a position of a pad isolation portion 3g in the pad region PAD. An isolation insulating layer 7 is conformally formed on the whole of the first surface 1a of the first substrate 1, and then, the deep trenches 3 are filled with a conductive material. An etch-back process is performed on the conductive material to form conductive patterns 9 in the deep trenches 3. Subsequently, filling insulation patterns 11 are formed on the conductive patterns 9, and the isolation insulating layer 7 on the first surface 1a is removed to expose the first surface 1a. Thus, a deep device isolation portion 13d, an outermost deep device isolation portion 3e and a pad isolation portion 13g are formed at the same time.

In a present embodiment, a gate insulating layer Gox, transfer gates TG, floating diffusion regions FD and a first interlayer insulating layer IL1 are formed on the first surface 1a of the first substrate 1. First contact plugs 17 are formed that penetrate the first interlayer insulating layer ILL. The first contact plugs 17 are in contact with the floating diffusion regions FD. First interconnection lines 15 and upper interlayer insulating layers IL are formed on the first interlayer insulating layer ILL. The first interconnection lines 15 include copper.

In a present embodiment, second contact plugs 18 connected to the first interconnection lines 15 are formed in the upper interlayer insulating layer IL. The second contact plugs 18 are formed from a metal that differs from that of the first interconnection lines 15. For example, the second contact plugs 18 includes tungsten. The second contact plugs 18 further include a barrier layer that includes a conductive metal nitride such as titanium nitride, tantalum nitride, or tungsten nitride. The second contact plugs 18 are formed by a damascene process. For example, the formation of the second contact plugs 18 includes forming via holes that penetrate an uppermost upper interlayer insulating layer IL to expose the first interconnection lines 15, sequentially forming a metal nitride layer and a metal layer in the via holes, and performing a planarization process.

Figure 9:
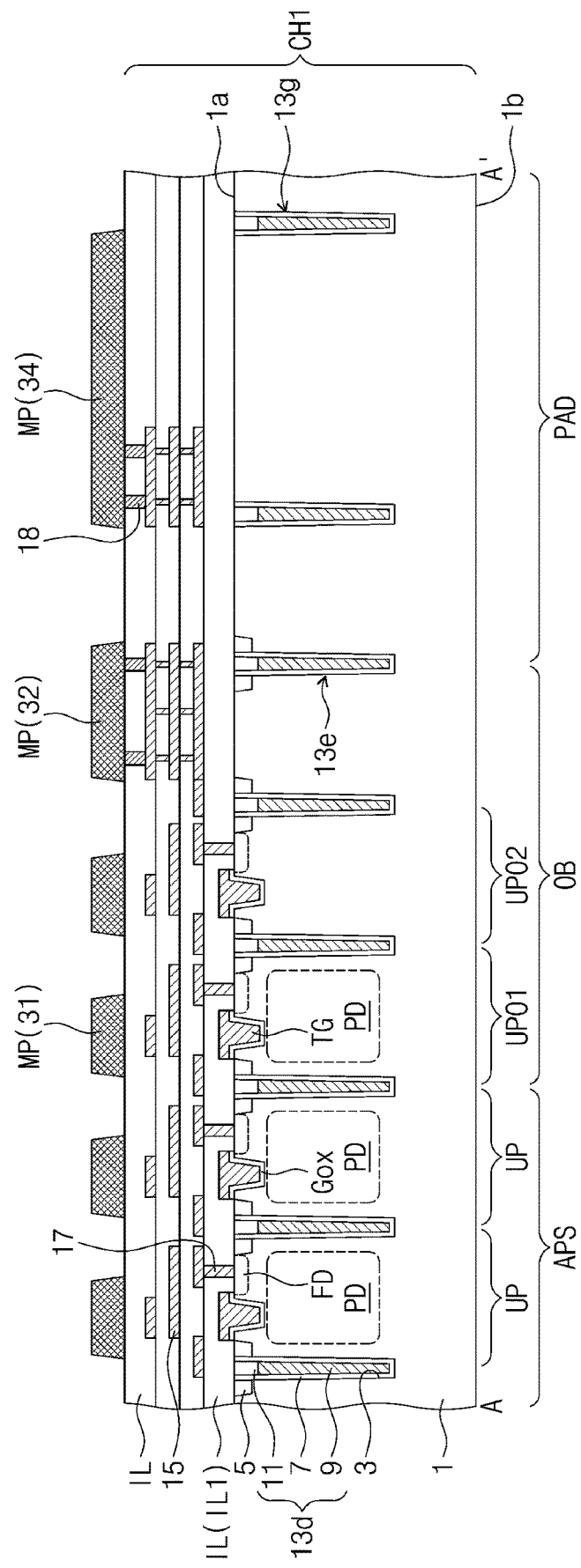

Referring to FIG. 9, in a present embodiment, metal patterns MP are formed on the second contact plugs 18. The metal patterns MP include a conductive pad 34 in the pad region PAD, a first metal pattern 31 in the pixel region APS, and a second metal pattern 32 in the optical black region OB. The metal patterns MP are formed of aluminum. The formation of the metal patterns MP includes forming a conductive layer that covers the upper interlayer insulating layer IL, and patterning the conductive layer to form the conductive pad 34, the first metal pattern 31 and the second metal pattern 32, which are separated from each other. The conductive layer includes first barrier layers BL1 on its top surface and bottom surface, as described with reference to FIGS. 3 to 5. For example, the formation of the metal patterns MP includes sequentially forming a first titanium nitride layer, an aluminum layer and a second titanium nitride layer, and patterning them. The metal patterns MP are formed using an etching process, and thus widths of upper portions of the metal patterns MP are less than widths of lower portions of the metal patterns MP. In addition, the first barrier layer BL1 is not provided on sidewalls of the metal patterns MP.

Figure 10:
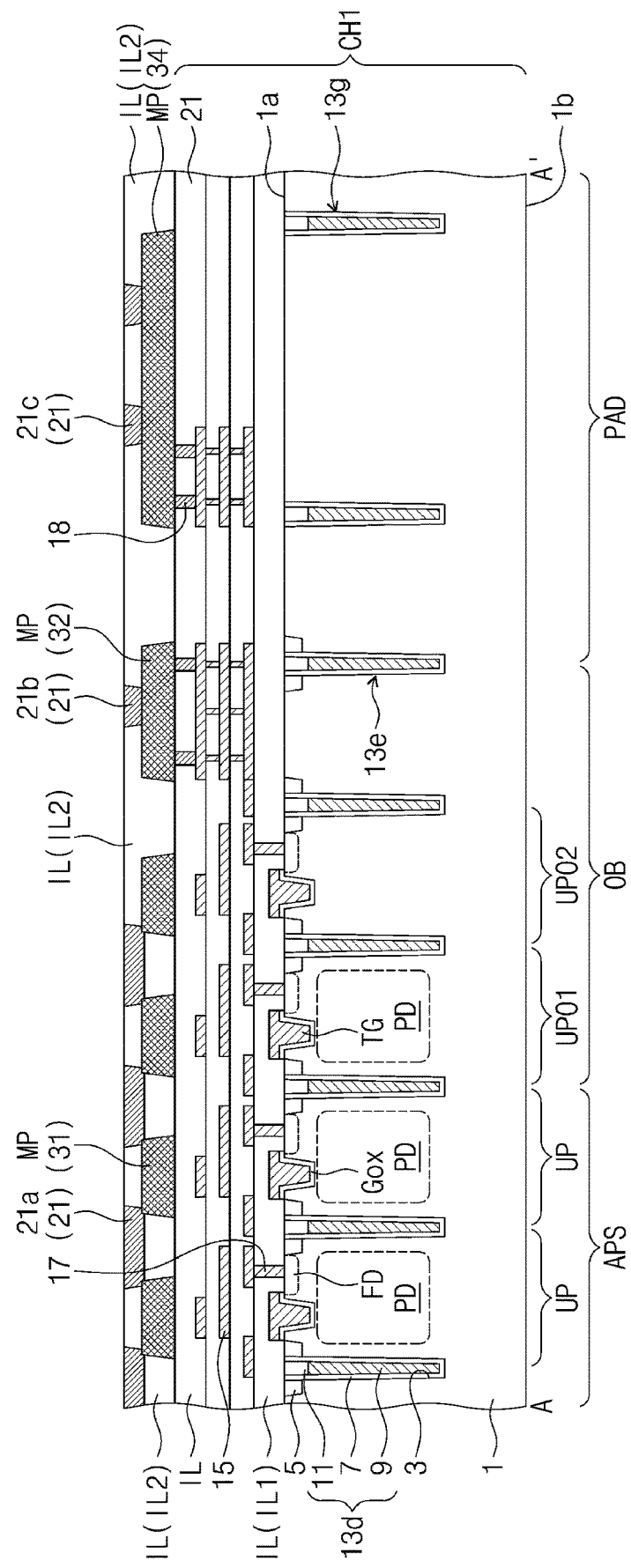

Referring to FIG. 10, in a present embodiment, a second interlayer insulating layer IL2 is formed that covers the metal patterns MP, and then, upper connection pads 21 connected to the metal patterns MP are formed in the second interlayer insulating layer IL2. An upper portion of the second interlayer insulating layer IL2 includes the first connection insulating layer CL1 described with reference to FIGS. 3 and 4. The first connection insulating layer CL1 includes at least one of SiCN, SiOCN, or SiC.

In a present embodiment, the upper connection pads 21 are formed by a damascene process. The upper connection pads 21 include copper. Each of the upper connection pads 21 includes the second barrier layer BL2 described with reference to FIGS. 3 to 5. The second barrier layer BL2 includes at least one of titanium, tantalum, tungsten, or any conductive metal nitride thereof. For example, the formation of the upper connection pads 21 includes forming recess regions in an upper portion of the second interlayer insulating layer IL2, forming the second barrier layer BL2 and a copper layer in the recess regions, and performing a planarization process until the second interlayer insulating layer IL2 is exposed. For example, the copper layer is formed by an electroplating process that uses a metal seed layer. When the recess regions are formed, upper portions, such as the first barrier layers BL1, of the metal patterns MP are also etched. The upper connection pads 21 include first upper connection pads 21a connected to the first metal pattern 31, second upper connection pads 21b connected to the second metal pattern 32, and third upper connection pads 21c connected to the conductive pad 34.

Figure 11:
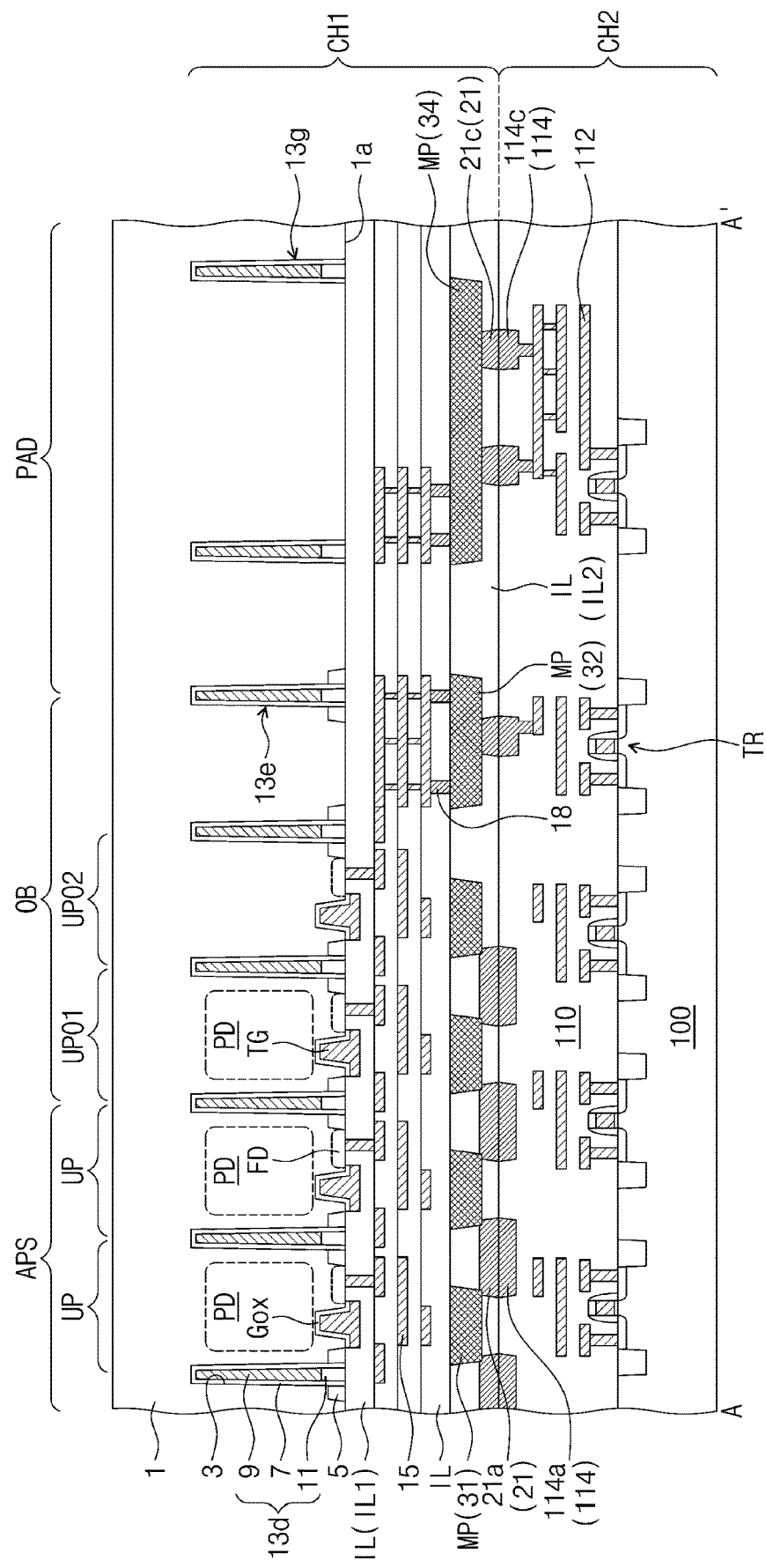

Referring to FIG. 11, in a present embodiment, a second chip CH2 that has the structure described with reference to FIG. 2 is prepared. The first chip CH1 is turned over. The first chip CH1 is placed on the second chip CH2 so that the upper interlayer insulating layer IL is in contact with a lower interlayer insulating layer 110 and the upper connection pads 21 are in contact with lower connection pads 114, and then, a thermal compression process is performed to bond the first chip CH1 and the second chip CH2 to each other.

Figure 12:
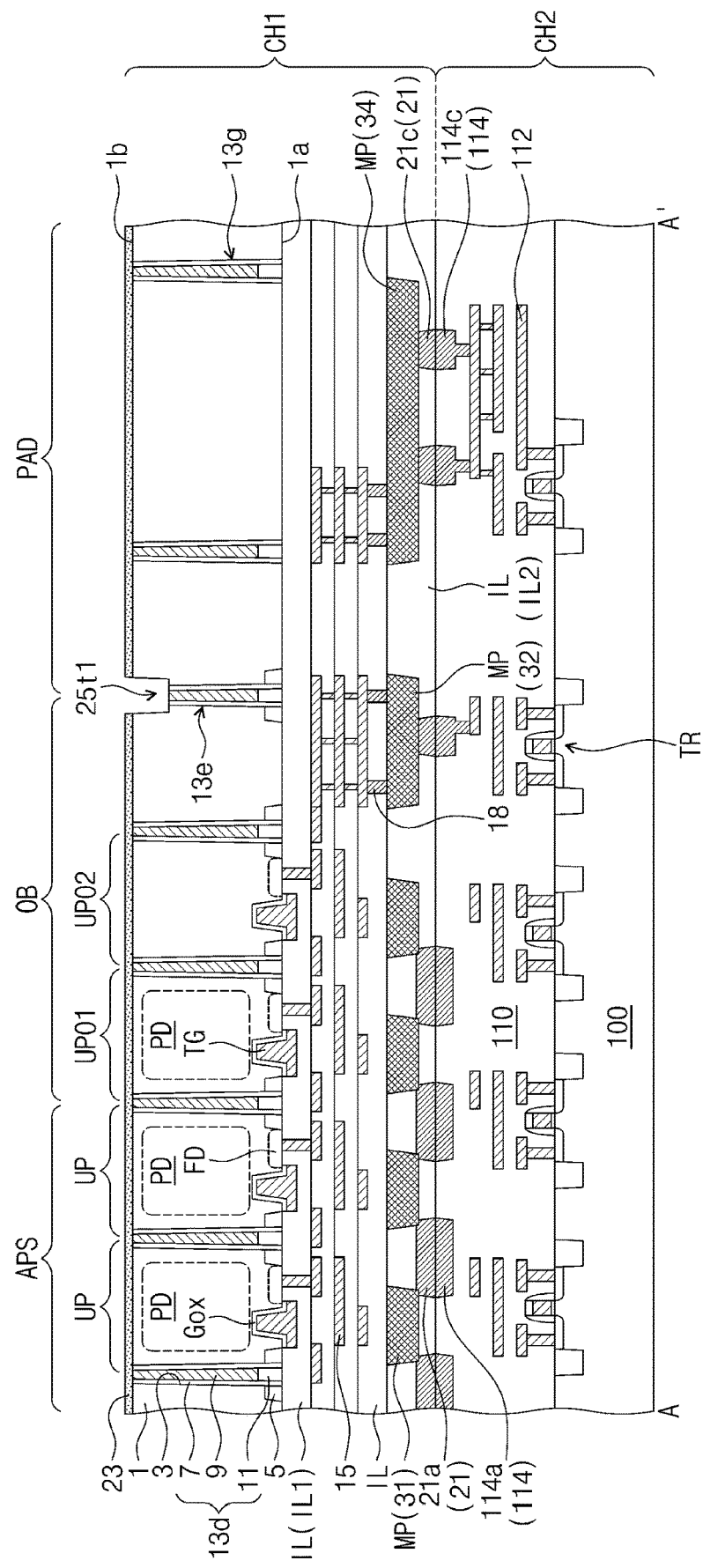

Referring to FIG. 12, in a present embodiment, a grinding process is performed on a second surface 1b of the first substrate 1, thereby reducing a thickness of the first substrate 1. At this time, the conductive patterns 9 of the deep device isolation portion 13d, the outermost deep device isolation portion 13e and the pad isolation portion 13g are exposed. A back insulating layer 23 is deposited on the second surface 1b of the first substrate 1. A first recess region 25t1 is formed by etching the back insulating layer 23, a portion of the first substrate 1, and a portion of the outermost deep device isolation portion 13e.

Figure 13:
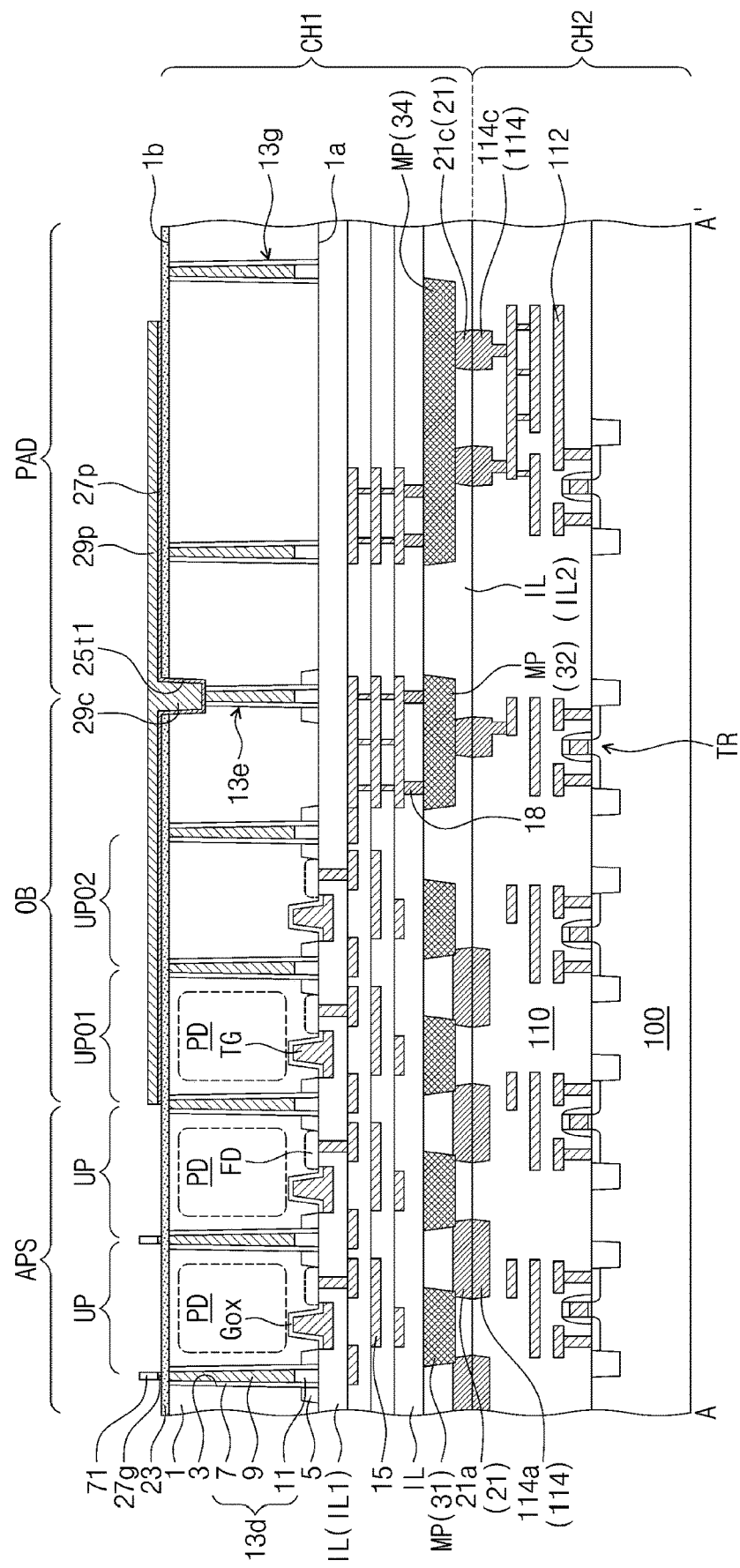

Referring to FIG. 13, in a present embodiment, a diffusion barrier layer and a first optical black layer are conformally formed on the second surface 1b of the first substrate 1, and then, a patterning process is performed on the first optical black layer. As a result, a first optical black pattern 29p is formed in the optical black region OB and the pad region PAD. The first recess region 25t1 is filled with the first optical black layer, and thus a bias contact plug 29c is formed in the first recess region 25t1. The diffusion barrier layer in the pixel region APS is exposed by the patterning process. A low-refractive index layer is formed that covers the exposed diffusion barrier layer in the pixel region APS, and then, a patterning process is performed to form a low-refractive index pattern 71 and a light blocking grid pattern 27g in the pixel region APS and to form a diffusion barrier pattern 27p in the optical black region OB and the pad region PAD. The low-refractive index layer is formed by, for example, a spin-coating process.

Figure 14:
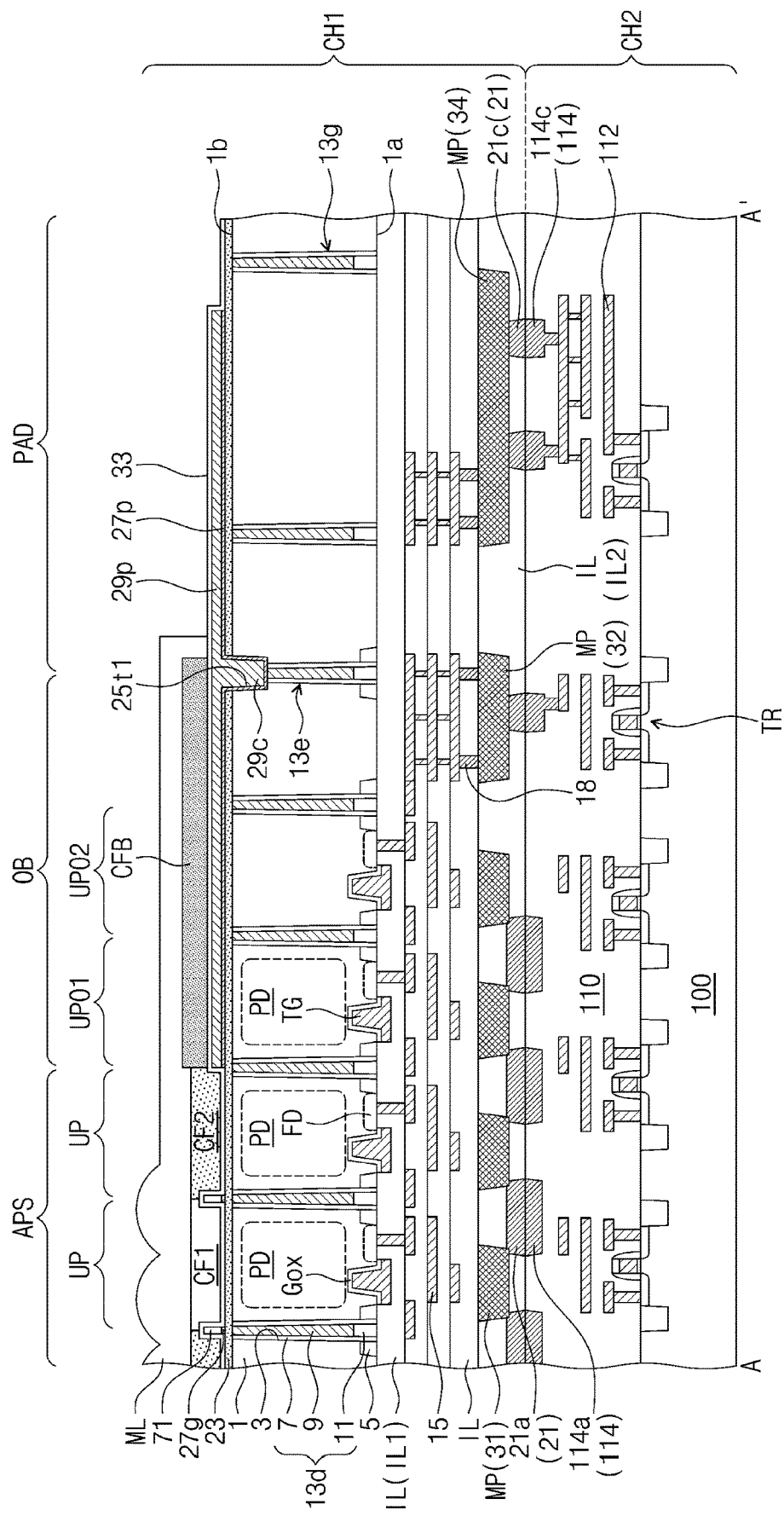

Referring to FIG. 14, in a present embodiment, a passivation layer 33 is conformally formed on the whole of the second surface 1b of the first substrate 1. Thereafter, color filters CF1 and CF2 and a second optical black pattern CFB are formed. The second optical black pattern CFB is formed simultaneously with a blue color filter. Subsequently, a micro lens layer ML is formed on the color filters CF1 and CF2 and the second optical black pattern CFB. The micro lens layer ML is formed in the pixel region APS and the optical black region OB.

Figure 15:
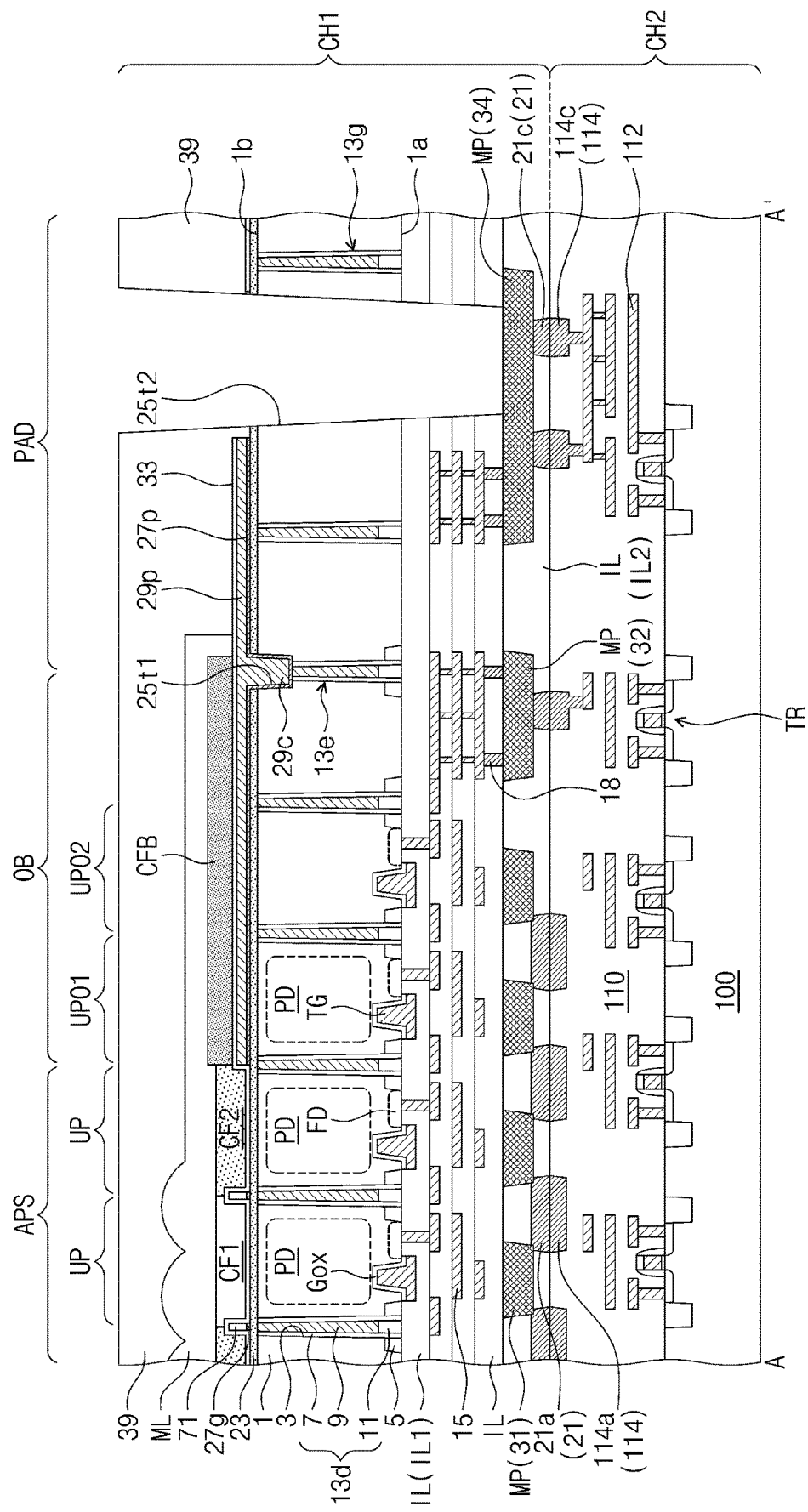

Referring to FIG. 15, in a present embodiment, a second recess region 25t2 that exposes the conductive pad 34 is formed in the pad region PAD. The formation of the second recess region 25t2 includes forming a mask pattern 39, and etching the first substrate 1 and the upper interlayer insulating layer IL using the mask pattern 39 as an etch mask. The mask pattern 39 includes at least one of a silicon nitride layer, a silicon oxide layer, or a silicon oxynitride layer. Thereafter, the mask pattern 39 is removed, and thus the image sensor 1000 described with reference to FIG. 2 is manufactured.

According to embodiments of the inventive concepts, a shielding structure that covers the pixel region is formed using the processes that form the conductive pad and the connection pads, and thus manufacturing processes can be simplified. In addition, the recess region that exposes the conductive pad is formed in a final process, and thus undesired material, such as a color filter, can be prevented from remaining on the conductive pad.

Figure 16:
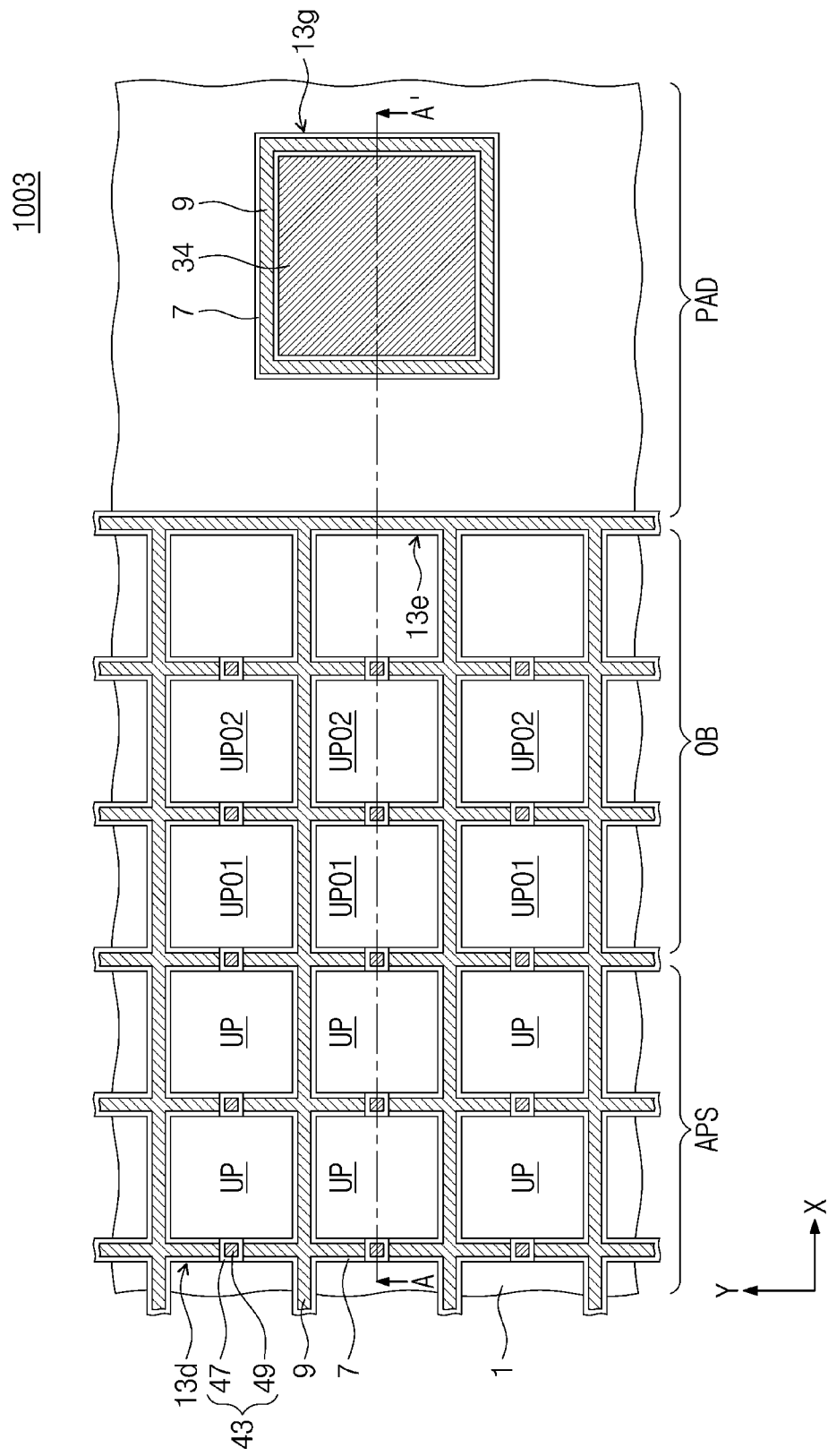
FIG. 16 is a plan view of an image sensor according to some embodiments of the inventive concepts.
Figure 17:
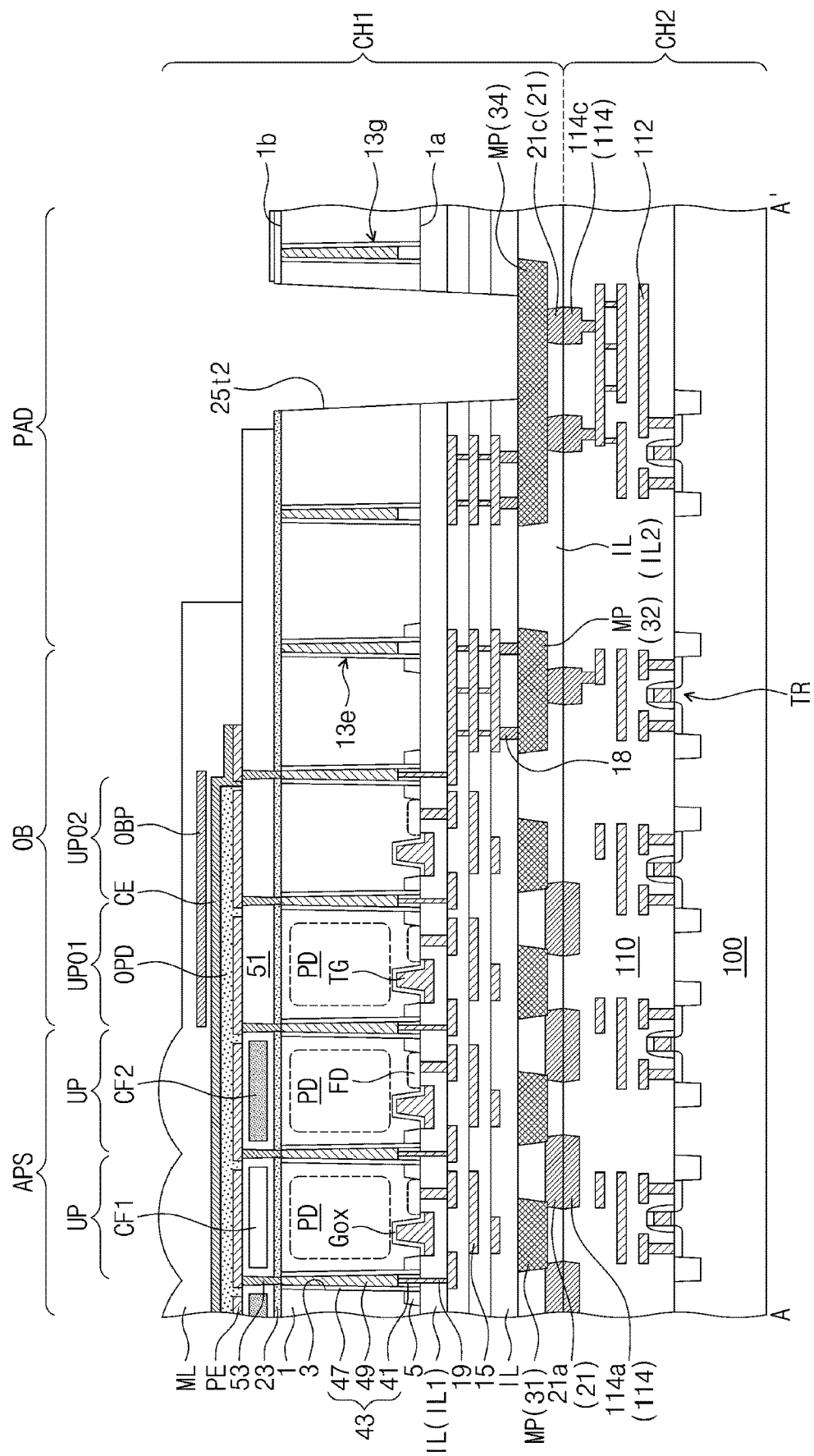
FIG. 17 is a cross-sectional view taken along a line A-A' of FIG. 16 according to some embodiments of the inventive concepts.

FIG. 16 is a plan view that illustrates an image sensor according to some embodiments of the inventive concepts. FIG. 17 is a cross-sectional view taken along a line A-A' of FIG. 16 according to some embodiments of the inventive concepts. Hereinafter, the descriptions of the same components as in above embodiments will be omitted for the purpose of ease and convenience in explanation.

Referring to FIGS. 16 and 17, an image sensor 1003 according to a present embodiment is an example of an organic CMOS image sensor. A through-structure 43 is disposed between unit pixels UP when viewed in a plan view. The through-structure 43 penetrates a deep device isolation portion 13d between adjacent unit pixels UP and divides the deep device isolation portion 13d into two segments. The through-structure 43 includes a through-conductive pattern 49, a through-filling insulation pattern 41, and a through-isolation insulating layer 47. The through-isolation insulating layer 47 insulates the through-conductive pattern 49 from the conductive pattern 9 of the deep device isolation portion 13d. The through-conductive pattern 49 includes the same material as the conductive patterns 9 of the deep device isolation portion 13d, the outermost deep device isolation portion 3e and the pad isolation portion 13g. A third contact plug 19 penetrates the first interlayer insulating layer IL1 and the through-filling insulation pattern 41 and connects the through-conductive pattern 49 to a corresponding first interconnection line 15. The first optical black pattern 29p described with reference to FIG. 2 is not provided. Color filters CF1 and CF2 are disposed on the back insulating layer 23 in the pixel region APS. In a present embodiment, the color filters CF1 and CF2 have different colors selected from blue or red. The color filters CF1 and CF2 are covered with or embedded in a planarization layer 51. In the pixel region APS and the optical black region OB, pixel electrodes PE are disposed on the planarization layer 51 and are spaced apart from each other. Fourth contact plugs 53 penetrate the planarization layer 51 and connect the pixel electrodes PE to the through-conductive patterns 49. The planarization layer 51 includes at least one of a silicon oxide layer or a silicon nitride layer. The pixel electrodes PE are covered with an organic photoelectric conversion layer OPD. The organic photoelectric conversion layer OPD includes a P-type organic semiconductor material and an N-type organic semiconductor material, which form a PN junction. Alternatively, the organic photoelectric conversion layer OPD includes quantum dots or a chalcogenide material. The organic photoelectric conversion layer OPD performs photoelectric conversion of light having a specific color, such as green. A common electrode CE is disposed on the organic photoelectric conversion layer OPD. The pixel electrodes PE and the common electrode CE include one or more of indium tin oxide (ITO), indium zinc oxide (IZO), zinc oxide (ZnO), or an organic transparent conductive material.

In a present embodiment, a micro lens layer ML is disposed on the common electrode CE. A second optical black pattern OBP is disposed in the micro lens layer ML in the optical black region OB. The second optical black pattern OBP includes, for example, an opaque metal, such as aluminum. The image sensor 1003 according to a present embodiment includes the organic photoelectric conversion layer OPD, and thus two colorscan be sensed at the same time in a single unit pixel UP.

An image sensor according to embodiments of the inventive concepts simplifies the interconnection structure between the conductive pad and the first chip. In addition, in an image sensor according to embodiments of the inventive concepts, a shielding structure that covers the pixel region can be formed together with the conductive pad and the connection pads, and thus the manufacturing processes can be simplified.

While the inventive concepts have been described with reference to embodiments, it will be apparent to those skilled in the art that various changes and modifications may be made without departing from the spirits and scopes of the inventive concepts. Therefore, it should be understood that the above embodiments are not limiting, but illustrative. Thus, the scopes of embodiments of the inventive concepts are to be determined by the broadest permissible interpretation of the following claims and their equivalents, and shall not be restricted or limited by the foregoing description.

What is claimed is:
1. An image sensor, comprising:
a first chip that includes a pixel region and a pad region; and
a second chip that is connected with one surface of the first chip and includes a first connection pad, a second connection pad, second interconnection lines, and circuits that drive the first chip,
wherein the first chip comprises:
  a first substrate;
  an interlayer insulating layer disposed between the first substrate and the second chip;
  first interconnection lines disposed in the interlayer insulating layer;
  a conductive pad entirely disposed within the interlayer insulating layer in the pad region of the first chip between the second chip and the first interconnection lines;
  a metal pattern disposed in the pixel region between the second chip and the first interconnection lines and disposed at a same level as the conductive pad, wherein the metal pattern is connected to the second chip by a conductive connection pad;
  a third connection pad disposed between the conductive pad and the second chip;
  a fourth connection pad disposed between the conductive pad and the second chip; and
  a recess region formed in the pad region that penetrates the first substrate and the interlayer insulating layer and exposes the conductive pad,
wherein the conductive pad is disposed on and connected to the third connection pad and the fourth connection pad,
wherein the first connection pad is connected to the third connection pad and the second connection pad is connected to the fourth connection pad,
wherein the conductive pad is connected to the second chip through the third and first connection pads, and through the fourth and second connection pads,
wherein the first and second connection pads are connected to the second interconnection lines, and
wherein the metal pattern includes a first barrier layer disposed on its bottom surface, the conductive connection pad includes a second barrier layer disposed on its top surface and sidewall, and a connection portion of the conductive connection pad and the metal pattern has a step structure in which the second barrier layer penetrates the first barrier layer of the bottom surface of the metal pattern.

2. The image sensor of claim 1, wherein the first connection pad is directly connected to the third connection pad and the second connection pad is directly connected to the fourth connection pad.

3. The image sensor of claim 1,
wherein the first connection pad and the third connection pad include a same metal, and
wherein the conductive pad includes a metal that differs from that of the first connection pad and the third connection pad.

4. The image sensor of claim 3,
wherein the conductive pad includes aluminum, and
wherein the first connection pad and the third connection pad include copper.

5. The image sensor of claim 3, wherein the conductive pad is thicker than the first connection pad.

6. The image sensor of claim 3, wherein the metal pattern includes a same material as the conductive pad.

7. The image sensor of claim 6,
wherein the metal pattern has a grid shape that includes openings.

8. The image sensor of claim 7,
wherein the first chip further comprises: a contact plug that connects the first interconnection lines to the conductive pad, and
wherein the contact plug is not provided in the pixel region between the metal pattern and the first interconnection lines.

9. The image sensor of claim 1, wherein the conductive pad comprises a barrier layer at each of a top surface and a bottom surface of the conductive pad, and
wherein the recess region penetrates the barrier layer.

10. The image sensor of claim 9, wherein the barrier layer is not provided on a sidewall of the conductive pad.

* * * * *